United States Patent
Pudas

(10) Patent No.: US 10,600,058 B2
(45) Date of Patent: Mar. 24, 2020

(54) ANTI-COUNTERFEIT SIGNATURE

(71) Applicant: PICOSUN OY, Espoo (FI)

(72) Inventor: Marko Pudas, Espoo (FI)

(73) Assignee: PICOSUN OY, Espoo (FI)

( * ) Notice: Subject to any disclaimer, the term of this patent is extended or adjusted under 35 U.S.C. 154(b) by 716 days.

(21) Appl. No.: 14/899,871

(22) PCT Filed: Jun. 27, 2013

(86) PCT No.: PCT/FI2013/050714
§ 371 (c)(1),
(2) Date: Dec. 18, 2015

(87) PCT Pub. No.: WO2014/207290
PCT Pub. Date: Dec. 31, 2014

(65) Prior Publication Data
US 2016/0140573 A1    May 19, 2016

(51) Int. Cl.
*G06Q 30/00* (2012.01)
*G09F 3/00* (2006.01)
*D21H 21/44* (2006.01)
*C23C 16/455* (2006.01)

(52) U.S. Cl.
CPC ....... *G06Q 30/0185* (2013.01); *C23C 16/455* (2013.01); *C23C 16/45555* (2013.01); *D21H 21/44* (2013.01); *G09F 3/00* (2013.01)

(58) Field of Classification Search
USPC ........................................ 438/703
See application file for complete search history.

(56) References Cited

U.S. PATENT DOCUMENTS

| 4,864,281 | A | 9/1989 | Fearon et al. |
| 6,216,949 | B1* | 4/2001 | Paugstadt ........... B41M 3/14 235/449 |
| 8,791,023 | B2* | 7/2014 | Ellinger .......... H01L 29/42384 257/632 |

(Continued)

FOREIGN PATENT DOCUMENTS

| AT | 509792 A1 | 11/2011 |
| CN | 101310043 A | 11/2008 |

(Continued)

OTHER PUBLICATIONS

Yoon, Bonin, Recent Functional Material Based Approaches to Prevent and Detect Counterfeiting, J. Mater. Chem. C, 2013, 1, (dated Dec. 12 2012, published Jan. 17, 2013), pp. 2388-2403 (Year: 2013).*

(Continued)

*Primary Examiner* — Jan P Mincarelli
*Assistant Examiner* — Michael Young
(74) *Attorney, Agent, or Firm* — Ziegler IP Law Group, LLC

(57) ABSTRACT

A method for applying an anti-counterfeit signature on a product, and an anti-counterfeit signature. The method includes selecting a substrate and a type of signature and forming a signature of the selected type on the substrate with atomic layer deposition, ALD, wherein forming the signature includes applying at least one layer having a predetermined property configured to be detected with an analysis method on the substrate by atomic layer deposition, ALD.

21 Claims, 3 Drawing Sheets

(56) References Cited

U.S. PATENT DOCUMENTS

| | | | |
|---|---|---|---|
| 2002/0094624 | A1 | 7/2002 | Ahn et al. |
| 2003/0023338 | A1* | 1/2003 | Chin .................. C23C 16/45525 |
| | | | 700/121 |
| 2003/0180451 | A1 | 9/2003 | Kodas et al. |
| 2006/0115982 | A1 | 6/2006 | Morisue et al. |
| 2008/0016367 | A1 | 1/2008 | Tanada et al. |
| 2008/0264563 | A1* | 10/2008 | Kuczynski .......... B29C 63/0013 |
| | | | 156/712 |
| 2009/0255470 | A1 | 10/2009 | Soininen et al. |
| 2015/0140334 | A1* | 5/2015 | Simons ............ G06K 19/06084 |
| | | | 428/407 |

FOREIGN PATENT DOCUMENTS

| | | |
|---|---|---|
| JP | H11-10771 A | 1/1999 |
| JP | 2000-204635 A | 7/2000 |
| JP | 2006-186331 A | 7/2006 |
| WO | 0200445 A1 | 1/2002 |
| WO | 2013/076347 A1 | 5/2013 |
| WO | WO-2014023523 A1 * 2/2014 ........... G03H 1/0011 |

OTHER PUBLICATIONS

Notification of ground of rejection received for Japanese Patent Application No. 2016-522674, dated May 10, 2017, 11 pages including 6 pages of English translation.
International Search Report for Application No. PCT/FI2013/050714, dated Feb. 27, 2014, 5 pages.
Written Opinion of the International Searching Authority for Application No. PCT/FI2013/050714, dated Feb. 27, 2014, 7 pages.
Extended European Search Report, Application No. 13888319.4-1958/3014533 PCT/FI2013/050714, dated Oct. 12, 2016, 7 pages.
Notice of Ground of Rejection received for Japanese Patent Application No. JP2016-522674, dated Feb. 28, 2018, 7 pages including 4 pages of English translation.
International Preliminary Report on Patentability and Written Opinion received for International Patent Application No. PCT/FI2013/050714, dated Jan. 7, 2016, 10 pages.
The Patent Office of the People's Republic of China, Notification of Fourth Office Action, Application No. 201380077763X, dated Jun. 11, 2019, 2 pages.
The Patent Office of the People's Republic of China, Search Report, Application No. 201380077763X, dated May 31, 2019, 2 pages.

* cited by examiner

US 10,600,058 B2

ANTI-COUNTERFEIT SIGNATURE

FIELD OF THE INVENTION

The present invention generally relates to atomic layer deposition. More particularly, the invention relates to a method for providing an identifiable signature on a product by atomic layer deposition.

BACKGROUND OF THE INVENTION

In an increasingly competitive world market, illegal copies and counterfeits of manufactured products are regularly offered for sale.

Accordingly, there are several anti-counterfeit technologies available, ranging from simple and visible, such as a bar-code, to complicated and "invisible", e.g. DNA taggants. The purpose of all these markers or signatures is to enable authentication of an item, e.g. by government, the manufacturer, end users or customs.

Prior art anti-counterfeit signatures can be hard to apply to a product and/or expensive. Furthermore, the structure of the signatures has been difficult to control in a precise and simple manner. Furthermore, especially the invisible and sophisticated signatures such as sequences of DNA-molecules can be removed, damaged accidentally or added later, and analyzing them is time-consuming, difficult and/or requires very specialized equipment and/or a laboratory environment. Majority of prior art anti-counterfeit methods requires an individual signature for each product, when the code is to be varied.

It is the object of the current invention to ameliorate the disadvantages of the prior art anti-counterfeit signature schemes with a method and apparatus for providing by atomic layer deposition a coating structure forming an identifiable signature, marker or code that is difficult to duplicate on a surface of a product according to different aspects of invention as described hereinafter.

SUMMARY

According to a first example aspect of the invention there is provided a method comprising:
  selecting a substrate and a type of signature; and
  forming a signature of the selected type on the substrate with atomic layer deposition, ALD; wherein
  forming the signature comprises applying at least one layer having a predetermined property configured to be detected with an analysis method on the substrate by atomic layer deposition, ALD.

Forming the signature may comprise applying a laminate structure of several layers on the substrate by atomic layer deposition, each layer having a property configured to be detected with an analysis method on the substrate by atomic layer deposition (ALD).

Applying the laminate structure of several layers may comprise applying several layers having different predefined properties.

Applying the laminate structure of several layers may comprise applying several layers comprising different materials.

Selecting a substrate may comprise selecting whether the signature is applied directly to the product or on a separate substrate.

The method may further comprise attaching the signature to a product, if the separate substrate is selected.

The method may further comprise covering the substrate with a layer configured to enable the removal of the substrate from the product.

The separate substrate may comprise at least one of a grain, a sphere, a particle, a filament and a nanotube.

The predefined property may comprise at least one of thickness of the layer, isotope ratio of the material of the layer, relative ratio of the material of a layer, optical property of the layer, electrical property of the layer, and magnetic property of the layer.

The analysis method may comprise at least one of transmission spectroscopy, reflection spectroscopy, fluorescence spectroscopy, optical spectroscopy, atomic force microscopy (AFM), scanning tunneling microscopy (STM), computed tomography microscopy (CTM), focused ion beam (FIB), time-of-flight elastic recoil detection analysis (TOF-ERDA) and diffuse reflectance spectroscopy (DRS).

The method may further comprise removing portions of the deposited layer or layers in order to provide a three dimensional structure.

According to a second example aspect of the invention there is provided an anti-counterfeit signature deposited with the method of the first example aspect.

According to a third example aspect of the invention there is provided an atomic layer deposition, ALD, reactor for depositing the anti-counterfeit signature of the second example aspect.

According to a fourth example aspect of the invention there is provided a computer program, comprising code for performing the method of the first example aspect, when the computer program is run on a processor.

According to a fifth example aspect of the invention there is provided a memory medium comprising the computer program of the fourth example aspect.

Different non-binding example aspects and embodiments of the present invention have been illustrated in the foregoing. The above embodiments are used merely to explain selected aspects or steps that may be utilized in implementations of the present invention. Some embodiments may be presented only with reference to certain example aspects of the invention. It should be appreciated that corresponding embodiments may apply to other example aspects as well. Any appropriate combinations of the embodiments may be formed.

BRIEF DESCRIPTION OF THE DRAWINGS

The invention will now be described, by way of example only, with reference to the accompanying drawings, in which.

DETAILED DESCRIPTION

Atomic Layer Epitaxy (ALE) method was invented by Dr. Tuomo Suntola in the early 1970's. Another generic name for the method is Atomic Layer Deposition (ALD) and it is nowadays used instead of ALE. ALD is a special chemical deposition method based on the sequential introduction of at least two reactive precursor species to at least one substrate.

The basics of an ALD growth mechanism are known to a skilled person. The at least one substrate is exposed to temporally separated precursor pulses in the reaction chamber to deposit material on the substrate surfaces by sequential self-saturating surface reactions. In the context of this application, the term ALD comprises all applicable ALD based techniques and any equivalent or closely related technologies, such as, for example MLD (Molecular Layer Deposition) and PEALD (Plasma Enhanced Atomic Layer Deposition) techniques.

A basic ALD deposition cycle consists of four sequential steps: pulse A, purge A, pulse B and purge B. Pulse A consists of a first precursor vapor and pulse B of another precursor vapor. Inactive gas and a vacuum pump are typically used for purging gaseous reaction by-products and the residual reactant molecules from the reaction space during purge A and purge B. A deposition sequence comprises at least one deposition cycle. A cycle created in correct conditions creates a conformal layer which has a specific thickness of e.g. 1.0 Å. Deposition cycles are repeated until the deposition sequence has produced a thin film or coating of desired thickness. Therefore the film thickness is substantially exactly defined by number of cycles. Deposition cycles can also be more complex. For example, the cycles can include three or more reactant vapor pulses separated by purging steps. All these deposition cycles form a timed deposition sequence that is controlled by a logic unit or a microprocessor. Further, the deposition can be considered as conformal for a part or particles, but with PEALD it can only be diagonal to a single surface. The diagonal deposition enables yet another specific feature to be created, i.e. a deposition in only one direction of the part.

Figure 1A:
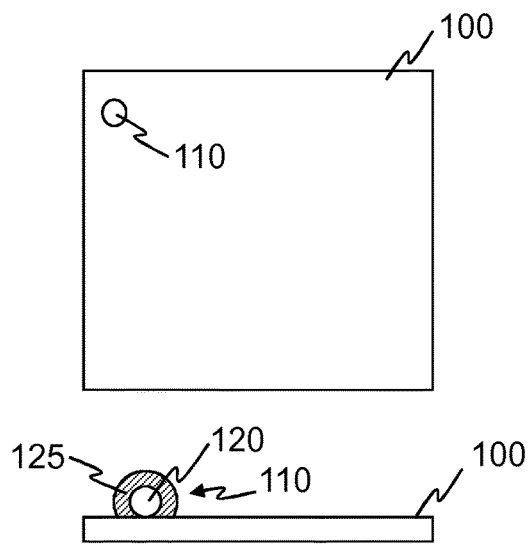
FIG. 1a shows schematic top and side views of an anti-counterfeit signature according to an example embodiment of the invention.

FIG. 1a shows schematic top and side views of an anti-counterfeit signature according to an example embodiment of the invention. A product 100, for example an integrated encapsulated discrete component, is provided with an anti-counterfeit signature, code or mark 110, hereinafter also referred to as signature.

The signature 110 is provided directly on or in the product, for example on the surface of the product 100, or alternatively beneath the surface of the product 100, or as a separate part, i.e. provided on a separate substrate attached to the product or the package thereof.

Figure 3:
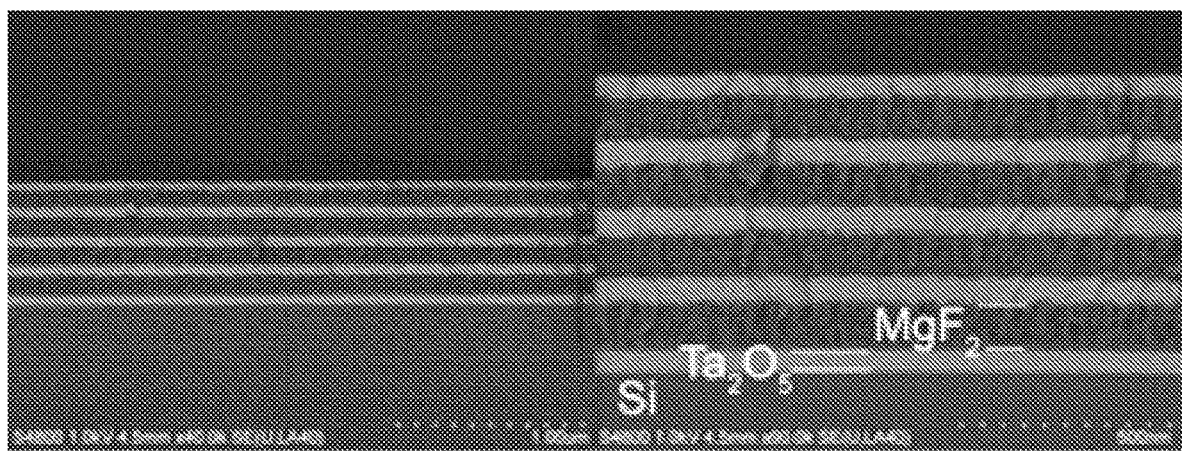
FIG. 3 shows an image depicting a cross section with different layers as visualized with an electron microscope.

The signature 110 comprises a layer or layers, i.e. a coating manufactured by atomic layer deposition, ALD, method. In an example embodiment, the layer or layers each comprise a detectable number of cycles, so that e.g. a certain number of cycles corresponds to a certain value of or in the code, for example 100-120 cycles marks for example a certain value, such as one. A skilled person appreciates that the signature is applicable on any product that can be coated with atomic layer deposition. In an example embodiment, the signature 110 further comprises a substrate for the ALD layers 125. An example of a cross section of optical filter in FIG. 3 shows detectable thicknesses of different layers on a surface of silicon.

In an example embodiment, the signature 110 according to an embodiment comprises a grain, sphere, filament, fibre, nanowire, nanotube or particle, i.e. a piece of a suitable substrate material, such as silicon or metal, 120 coated with a layer, or film, 125 by atomic layer deposition. The piece of substrate is in an embodiment invisible to naked eye, and only to be discovered and/or analyzed using a suitable method as hereinafter described. The piece of substrate is attached to the product with conventional means during or after the manufacture of the product. In an example embodiment, more than one grain comprising a layer or layers deposited with atomic layer deposition (ALD) method are embedded or otherwise attached to a product or the package thereof.

Although one coating layer 125 for the grain 120 is shown, several layers of same or different materials are applied as an alternative, as for example hereinafter described with reference to FIGS. 1b and 1c. In an example embodiment, the layer or layers comprise metal oxide material or materials, and accordingly the grain 120, such as a nanowire or a particle, is extremely durable against mechanical and/or thermal stresses during manufacture and/or assembly of the product to which the signature is being applied.

Furthermore, the layer or layers need not cover the whole surface of the grain, but instead or in addition a layer or layers cover a part of the surface of the grain. Furthermore, the thickness of a layer is not uniform in a further embodiment. In a further embodiment, the properties, such as optical, magnetic, electrical or mechanical properties and/or materials of the layers are varied between the layers and/or within the layers.

In a further embodiment, the grain is further covered with a layer that can be removed e.g. by dissolving or melting, and hence the grain is easily removed from the product for example after inspection, or removed from the product prior to analyzing for example by dissolving the layer with a suitable liquid and therethrough extracting the grain into the liquid for subsequent analysis. For example, the layer, or additional layers are configured to have a property enabling a detection thereof via a method such as UV fluorescence microscopy. In a further example embodiment, the grain has magnetic properties, so that it may be collected easily with magnetic attraction, for example into a specific location or volume for analysis.

Figure 1C:
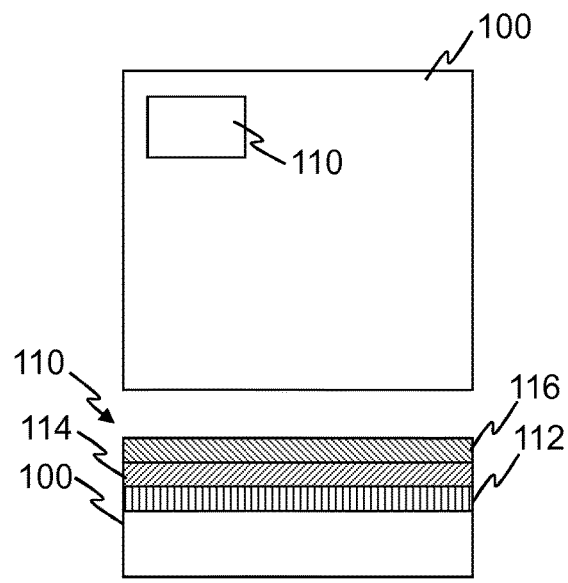
FIG. 1c shows schematic top and side views of an anti-counterfeit signature according to an example embodiment of the invention.
Figure 1B:
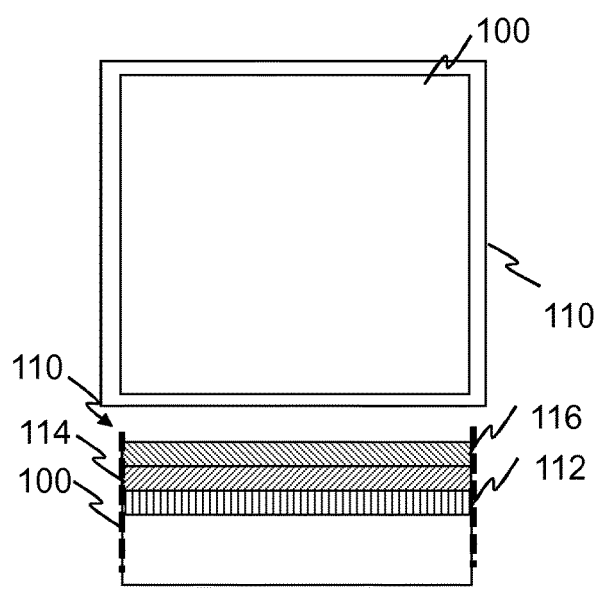
FIG. 1b shows schematic top and side views of an anti-counterfeit signature according to an example embodiment of the invention.

FIG. 1b shows schematic top and side views of an anti-counterfeit signature according to an example embodiment of the invention. The discontinuous line indicates that FIG. 1 b shows a cross section of an otherwise conformal coating. Again, a product 100, for example an encapsulated discrete component, is provided with an anti-counterfeit signature, code or mark 110. The signature 110 according to an embodiment comprises layers 112,114,116 deposited on the product 100, or alternatively on a separate substrate provided on the product 100, by atomic layer deposition. In other words, the signature 110 comprises a laminate structure deposited by atomic layer deposition. Although three layers are shown, the number of the layers is not limited thereto, or to any particular number, as atomic layer deposition is capable of producing very thin layers, i.e. layers having for example a thickness in the magnitude of 0.1 nanometers and accordingly an increase in the number of layers does not immediately affect the surface topology of a product. The layers 112,114,116 form a so called laminate structure that is easily produced with atomic layer deposition (ALD) due to the precise control of layer properties, such as thickness, enabled by the method.

FIG. 1c shows an embodiment where the deposited layers are restricted to defined area with known pattering methods.

In an embodiment, the layers 112,114,116 of the signature form a type of code, i.e. comprise information encoded therein that is read with a suitable method as needed. The properties of the layer or layers are predefined and are easily controlled by varying the atomic layer deposition (ALD) method. The predefined property or properties of the layer or layers are configured to be detected with an instrument using a suitable analysis method when the signature is wished to be verified. The code is created by varying for example the source materials and conditions under which the atomic layer deposition is carried out. The information is encoded in the signature for example by varying the thicknesses, the material of the layers, by varying the isotope ratios of a material or the materials or by varying the relative ratio of a certain element in a composition, such as oxygen ratio of an oxide. In a further embodiment, the properties, such as optical, magnetic, electrical or mechanical properties and/or materials of the layers are varied between the layers and/or within the layers, as also hereinbefore described. In an example embodiment, the code is formed for example by layers having different thickness, each thickness corresponding to a predefined value, such as a number or a letter, in the code. As an example, the laminate structure comprises alternating layers of $Ta_2O_5$ and $MgF_2$ on a silicon substrate as shown in FIG. 3.

The skilled person appreciates, that although the laminate structure is illustrated on a flat substrate or on a flat surface of the product, the signature comprising several layers according to an embodiment is readily applicable to a variety of substrates and surfaces, for example such substrates as described hereinbefore with reference to FIG. 1a.

Figure 1D:
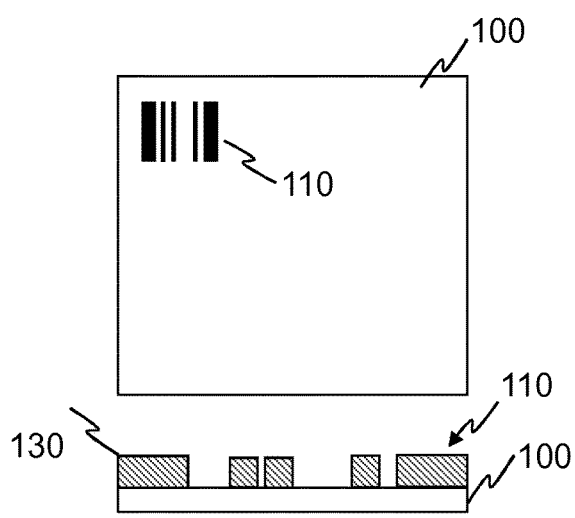
FIG. 1d shows schematic top and side views of an anti-counterfeit signature according to an example embodiment of the invention.

FIG. 1d shows schematic top and side views of an anti-counterfeit signature according to an example embodiment of the invention. Again, a product 100, for example an integrated circuit, IC, is provided with an anti-counterfeit signature, code or mark 110. The signature 110 according to an embodiment comprises structures 130, i.e. a layer having a first thickness at parts of the signature and a second thickness at parts of the signature. The signature is again deposited on a selected part of the surface or parts of the product 100, or alternatively on a separate substrate provided on the product 100, by atomic layer deposition. The structures 130 form a two dimensional code akin to a bar-code or a QR-code comprising information encoded therein. In an example embodiment, the pattern is created with known methods of thin film pattern creation, such as photoresist deposition and etching, atomic force microscopy (AFM) scratching, burning, ion beam etching, electron beam etching, lithography or nanolithography.

Figure 1E:
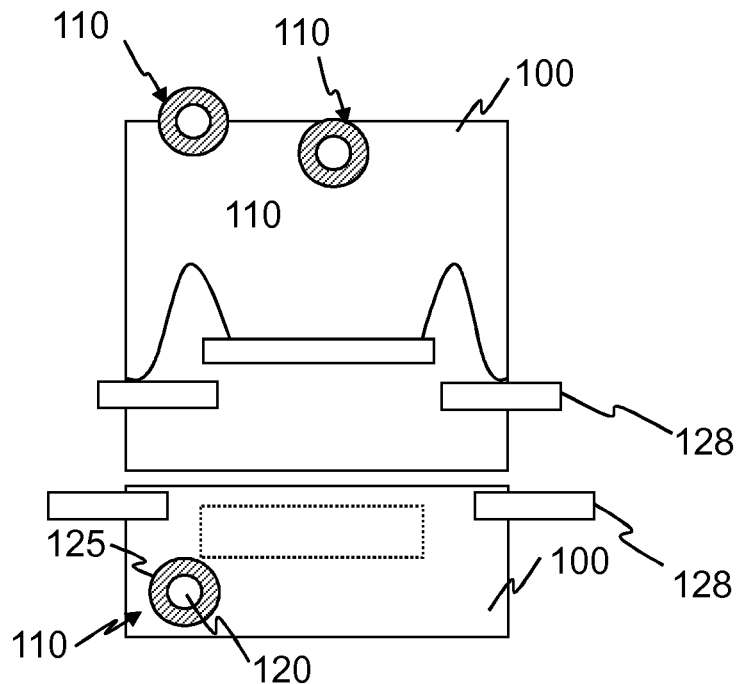
FIG. 1e shows schematic side and top views of an anti-counterfeit signature according to an example embodiment of the invention.

FIG. 1e shows a more particular example embodiment of the invention, in case of an epoxy packed silicon component. Silicon is embedded inside the epoxy, with bonding wires and leadframe 128 leading the connections out of the package. At least one anti-counterfeit signature particle 110 is provided on the surface or partially inside the surface.

The structure of the signature is created by conformally depositing a layered, i.e. a laminate, structure as hereinbefore described to a substrate, 120, or to the surface of the product and in an example embodiment subsequently removing portions of the layer or layers deposited, or providing a cross section, in order to create the three dimensional structure. Alternatively, the structure could be created by coating separately portions of the surface of the substrate. The removal of the parts of the layer is in an embodiment effected with a known method such as dissolving, etching or melting.

Figure 2:
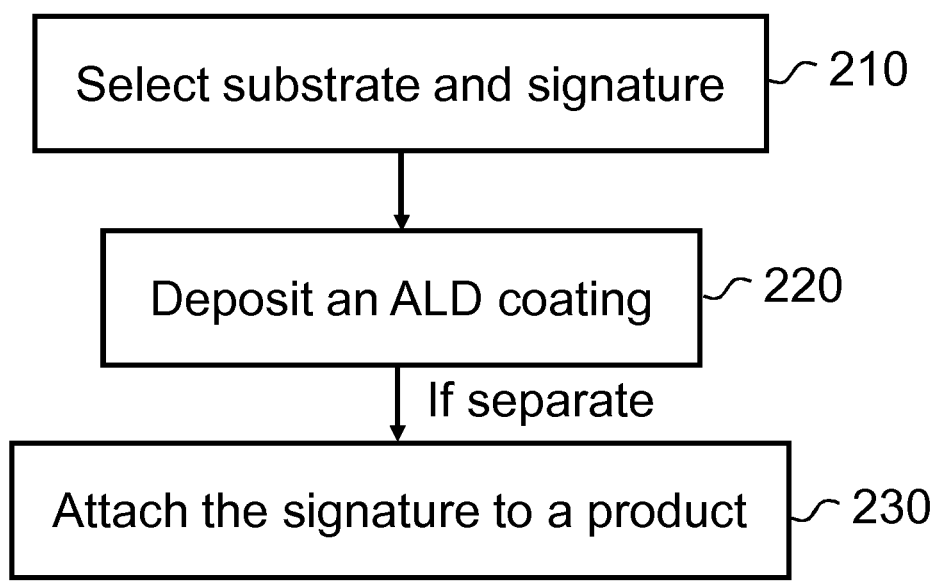
FIG. 2 shows a schematic flow diagram of a method according to an example embodiment of the invention.

FIG. 2 shows a schematic flow diagram of a method according to an example embodiment of the invention. At step 210, a substrate for an anti-counterfeit signature is selected as well as the type of signature. As hereinbefore described the signature is either directly applied, i.e. deposited on the product itself, the signature is deposited on a separate substrate, or the signature comprises a separate substrate coated by ALD, such as a coated grain. The type of signature is selected in accordance with example embodiments as described hereinbefore, or as a combination thereof. At step 220 an ALD coating is applied to the selected substrate according to the selected type of signature. If the signature is applied on a separate substrate, e.g. on a separate particle or grain, the signature is attached to a desired product at step 230 as hereinbefore described, for example by embedding a grain coated with the signature layer into the product, e.g. in an epoxy layer.

In order to analyze, i.e. to verify, the signature, the layer or layers are analyzed with a suitable instrument and suitable analysis method applied either directly on the product comprising the signature or after the substrate comprising the signature has been removed from the product. Suitable analysis methods, in an example embodiment diagonal to surface or cross section, of material and layer property measurement comprise for examples methods such as transmission spectroscopy, reflection spectroscopy, fluorescence spectroscopy, optical spectroscopy, atomic force microscopy (AFM), scanning tunneling microscopy (STM), computed tomography microscopy (CTM), focused ion beam (FIB), time-of-flight elastic recoil detection analysis (TOF-ERDA) or diffuse reflectance spectroscopy (DRS). In an example embodiment, indirect effects of the layers are created to be detected with optical spectroscopy.

Without limiting the scope and interpretation of the patent claims, certain technical effects of one or more of the example embodiments disclosed herein are listed in the following: A technical effect is a cost-effective anti-counterfeiting signature. Another technical effect is to provide an easily applicable anti-counterfeiting signature. Still another technical effect is a provision of a signature suitable for a wide variety of products. Still a further technical effect is to provide an anti-counterfeiting signature with improved flexibility and variability. Still a further technical effect is to provide an anti-counterfeiting signature the properties of which can easily be predefined and controlled. Furthermore, a technical effect is to provide an anti-counterfeit signature that can be created on a large number of particles, which particles can be divided to large numbers of samples thus making the cost of creating a signature relating to a production series low.

It should be noted the some of the functions or method steps discussed in the preceding may be performed in a different order and/or concurrently with each other. Furthermore, one or more of the above-described functions or method steps may be optional or may be combined.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments of this invention may be used to advantage without the corresponding use of other features. As such, the foregoing description should be considered as merely illustrative of the principles of the present invention, and not in limitation thereof. Hence, the scope of the invention is only restricted by the appended patent claims.

The invention claimed is:

1. A method for applying an anti-counterfeit signature on a product, comprising:
    selecting a substrate and a type of code; and
    forming an anti-counterfeit signature in the form of a code of the selected type on the substrate with atomic layer deposition, ALD; wherein
    forming the code comprises applying on the substrate by atomic layer deposition (ALD), layers having different predetermined thicknesses, defined by a detectable number of deposition cycles configured to be detected with an analysis method, the thickness corresponding to predefined values in the code.

2. The method of claim 1, wherein forming the signature comprises applying a laminate structure of several layers on the substrate by atomic layer deposition, each layer having a property configured to be detected with an analysis method on the substrate by atomic layer deposition (ALD).

3. The method of claim 1, wherein applying the laminate structure of several layers comprises applying several layers having different predefined properties.

4. The method of claim 1, wherein applying the laminate structure of several layers comprises applying several layers comprising different materials.

5. The method of claim 1, wherein selecting a substrate comprises selecting that the signature is applied on a separate substrate.

6. The method of claim 5, further comprising attaching the signature to a product, when the separate substrate is selected.

7. The method of claim 6, further comprising covering the substrate with a layer configured to enable the removal of the substrate from the product.

8. The method of claim 5, wherein the separate substrate comprises at least one of a grain, a sphere, a particle, a filament and a nanotube.

9. The method of claim 1, wherein layers applied on the substrate have a predefined property comprising at least one of isotope ratio of the material of the layer, and relative ratio of the material of a layer.

10. The method of claim 1, wherein the analysis method comprises at least one of transmission spectroscopy, reflection spectroscopy, fluorescence spectroscopy, optical spectroscopy, atomic force microscopy (AFM), scanning tunneling microscopy (STM), computed tomography microscopy (CTM), focused ion beam (FIB), time-of-flight elastic recoil detection analysis (TOF-ERDA) and diffuse reflectance spectroscopy (DRS).

11. The method of claim 1, further comprising removing portions of the deposited layer or layers in order to provide a three dimensional structure.

12. An anti-counterfeit signature deposited with the method of claim 1.

13. An atomic layer deposition, ALD, reactor configured to perform the method of claim 1.

14. A computer program, comprising:
    code for performing a method of claim 1,
    when the computer program is run on a processor.

15. A non-transitory memory medium comprising the computer program of claim 14.

16. The method of claim 1, wherein layers applied on the substrate have a predefined property comprising at least one of optical property of the layer, electrical property of the layer, and magnetic property of the layer.

17. The method of claim 1, wherein selecting a substrate comprises selecting that the signature is applied on directly to the product.

18. A method for applying an anti-counterfeit signature on a product, comprising:
    selecting a substrate and a type of code; and
    forming an anti-counterfeit signature in the form of a code of the selected type, comprising information encoded therein, on the substrate with atomic layer deposition, ALD; wherein
    forming the code comprises applying on the substrate by atomic layer deposition, ALD, a laminate structure comprising layers having different predefined materials and different predetermined thicknesses, by which the information is encoded, the thicknesses being defined by a detectable number of deposition cycles configured to be detected with an analysis method.

19. Method of claim 18, wherein the laminate structure comprises alternating layers of a first material and a second material.

20. Method of claim 18, wherein the laminate structure comprises alternating layers of a first material having a first thickness and a second material having a second thickness.

21. Method of claim 19, wherein at least one of the first material and the second material is a metal oxide.

* * * * *